(12) United States Patent
Greene et al.

(10) Patent No.: US 10,177,039 B2
(45) Date of Patent: Jan. 8, 2019

(54) SHALLOW TRENCH ISOLATION STRUCTURES AND CONTACT PATTERNING

(71) Applicant: INTERNATIONAL BUSINESS MACHINES CORPORATION, Armonk, NY (US)

(72) Inventors: Andrew M. Greene, Albany, NY (US); Ravikumar Ramachandran, Pleasantville, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/804,228

(22) Filed: Nov. 6, 2017

(65) Prior Publication Data

US 2018/0226299 A1 Aug. 9, 2018

Related U.S. Application Data

(63) Continuation of application No. 15/427,423, filed on Feb. 8, 2017.

(51) Int. Cl.
*H01L 21/8234* (2006.01)
*H01L 29/78* (2006.01)
(Continued)

(52) U.S. Cl.
CPC .. *H01L 21/823481* (2013.01); *H01L 21/3081* (2013.01); *H01L 21/31111* (2013.01);
(Continued)

(58) Field of Classification Search
CPC ..... H01L 21/823481; H01L 21/823821; H01L 21/823871; H01L 21/823878;
(Continued)

(56) References Cited

U.S. PATENT DOCUMENTS 9,673,102 B2 6/2017 Liu et al.
2006/0157782 A1 7/2006 Amali et al.
(Continued)

OTHER PUBLICATIONS

Andrew M. Greene et al., Pending U.S. Appl. No. 15/427,423 entitled "Shallow Trench Isolation Structures and Contact Patterning," filed with the U.S. Patent and Trademark Office on Feb. 8, 2017.

(Continued)

*Primary Examiner* — Jose R Diaz
(74) *Attorney, Agent, or Firm* — Cantor Colburn LLP; Vazken Alexanian

(57) ABSTRACT

A dual layer shallow isolation trench region for semiconductor structures including field effect transistors (FETs) and methods for making the same. The first layer of the shallow trench isolation region includes a dielectric material disposed between adjacent FETs. The second layer is an etch resistant material disposed on the dielectric material and has an increased etch resistance relative to the dielectric material. The etch resistant material overlays the shallow trench region to provide the dual layer shallow trench isolation region, which permits self-alignment of contacts to the source and/or drain of FETs.

15 Claims, 4 Drawing Sheets

(51) Int. Cl.
  *H01L 29/06* (2006.01)
  *H01L 23/535* (2006.01)
  *H01L 27/088* (2006.01)
  *H01L 21/308* (2006.01)
  *H01L 21/311* (2006.01)
  *H01L 29/66* (2006.01)

(52) U.S. Cl.
  CPC .............. *H01L 21/823431* (2013.01); *H01L 21/823475* (2013.01); *H01L 23/535* (2013.01); *H01L 27/0886* (2013.01); *H01L 29/0653* (2013.01); *H01L 29/66795* (2013.01); *H01L 29/785* (2013.01)

(58) Field of Classification Search
  CPC ............. H01L 21/76224; H01L 29/785; H01L 29/7855; H01L 27/0924
  See application file for complete search history.

(56) References Cited

U.S. PATENT DOCUMENTS

| | | | |
|---|---|---|---|
| 2009/0159933 A1* | 6/2009 | Pinto ................. | H01L 21/76224 257/255 |
| 2016/0035743 A1 | 2/2016 | Cheng et al. | |
| 2017/0117411 A1* | 4/2017 | Kim ................... | H01L 27/1104 |

OTHER PUBLICATIONS

List of IBM Patents or Patent Applications Treated as Related; (Appendix P), Date Filed Nov. 6, 2017; 2 pages.

\* cited by examiner

SHALLOW TRENCH ISOLATION STRUCTURES AND CONTACT PATTERNING

DOMESTIC PRIORITY

This application is a CONTINUATION of U.S. Non-Provisional application Ser. No. 15/427,423, filed Feb. 8, 2017, which is incorporated by reference herein in its entirety.

BACKGROUND

The present invention relates in general to fabrication methods and the resulting semiconductor device structures. More specifically, the present invention relates to fabrication methods and resulting device structures for providing a dual layer shallow trench isolation structure to improve contact patterning margins.

Typical semiconductor devices are formed using active regions of a wafer. The active regions are defined by isolations regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting N-type or P-type impurities in the layer of semiconductor material. Disposed between the source and the drain is a channel (or body) region. Disposed above the body region is a gate electrode. The gate electrode and the body are spaced apart by a gate dielectric layer.

SUMMARY

According to one or more embodiments of the present invention, a semiconductor structure includes a plurality of field effect transistors (FET). Each FET is separated from an adjacent FET by a shallow trench isolation region. Each of the shallow trench isolation regions includes a first layer and a second layer. The first layer includes a dielectric material and the second layer includes an etch resistant material disposed on the dielectric material. The etch resistant material has an increased etch resistance relative to the dielectric material. An electrically conductive contact material (e.g., metal) is provided to a source or drain region of the FET, wherein the contact material is aligned to the etch resistant material overlaying the shallow trench region.

In one or more embodiments of the present invention, a method of increasing a process margin for self-aligned contact formation to a field effect transistor (FET) includes providing an array of FETs. Each one of the FETs is separated from an adjacent FET by a shallow trench isolation region. The FETS include a source and/or drain region. The shallow trench isolation region is filled with a first dielectric layer. A second dielectric layer is deposited onto the first dielectric layer overlaying the shallow trench isolation region to provide the shallow trench isolation region with two dielectric layers. The first and second dielectric layer have different etch rates. The second dielectric layer is patterned to form openings overlying the shallow isolation trench region and the openings are filled with an etch resistant material. Contact openings are formed in the second dielectric layer to expose the source and/or drain regions, wherein the contact openings are self-aligned to the etch resistant material. The contact openings are filled with an electrically conductive material to form contacts.

In one or more embodiments of the present invention, a method for contact patterning during fabrication of a semiconductor structure device includes forming a dual layer shallow trench isolation region. The dual layer shallow trench isolation region includes a dielectric layer and an etch resistant layer overlying the dielectric layer, wherein the etch resistant layer has an increased etch resistance relative to the dielectric layer. The shallow trench isolation region separates adjacent field effect transistors (FETs). A contact opening is etched in an oxide layer overlying a source or drain region, wherein the contact opening is self-aligning to the etch resistant layer overlying the shallow trench isolation region. The contact opening has a depth equal to a thickness of the etch resistant layer and is filled with an electrically conductive material.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
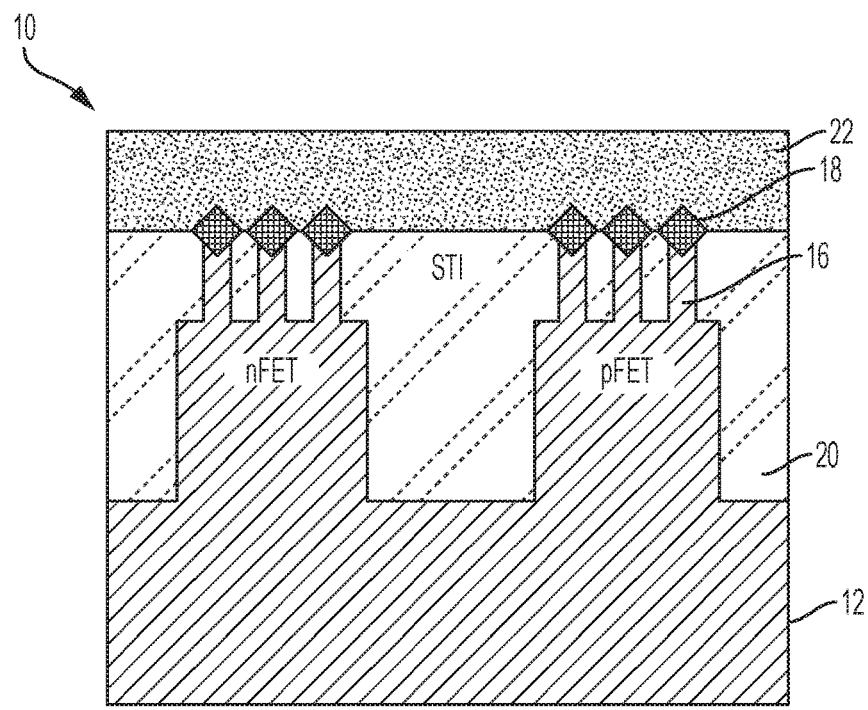
FIG. 1 depicts a cross-sectional view of a FinFET structure subsequent to deposition of n interlayer dielectric on a top source or drain region according to one or more embodiments of the present invention.

As previously described herein, the active regions of each semiconductor device, MOSFET or otherwise, are often separated by isolation regions. One technique for forming isolation regions is shallow trench isolation (STI). STI involves forming trenches in a layer of silicon and then filling the trenches with silicon oxide. Alternatively, the trenches can be lined with a silicon oxide liner formed by a thermal oxidation process and then filled with additional silicon oxide or another material, such as polysilicon. These "filled" trenches define the size and placement of the active regions.

A pervasive trend in modern integrated circuit manufacture is to produce semiconductor devices, (including, for example, MOSFETs, other types of transistors, memory cells, and the like) that are as small as possible. It is also advantageous to reduce the scale of the isolation regions that are formed between the devices. Although the fabrication of smaller devices and isolation regions allows more devices to be placed on a single monolithic substrate for the formation of relatively large circuit systems in a relatively small die area, this downscaling can result in a number of performance degrading effects.

The present invention is generally directed to semiconductor structures including a plurality of active regions. The active regions can include field effect transistors (FETs) such as FinFET structures and methods to form such structures including improved contact tip-to-tip margins and top source/drain to contact margins. At tight pitches, the source/drain contacts and the gate contacts are pushed closer to each other resulting in a reduction of the margins needed to form both structures without touching each other, which can lead to shorts. Prior process flows and structures utilized a nitride cap on the gate, also referred to as a sacrificial nitride, to prevent the source/drain contacts form shorting to the gates. Dry etch processes were typically used to remove the sacrificial nitride between the gates. However, with reduced margins, the reactive ion etch processes that are commonly used to form the source/drain contacts can erode the sacrificial nitride protection on top of the gates resulting in shorts therebetween.

As will be described in greater detail below, the present method and resulting semiconductor structures overcome the margin issues by replacing a top portion of the shallow trench isolation (STI) region, which is typically and entirely formed of an oxide dielectric of the same material, with a second material having greater resistance than the underlying dielectric material to the contact etch. As a result of the dual layered STI region, one can etch the oxide to form the contacts to the source/drain regions of the FETs and subsequently fill the contacts with a metal in the contact regions while the material overlaying the STI region remains intact because the top portion of the STI region is formed of a material more resistant to the contact etch relative to the oxide that the material replaced. The material on the top portion of the STI ensures that the source/drain contacts are aligned directly to the active areas and do not encroach into the STI regions. Moreover, replacing the top portion of the STI with a etch resistant material such as a nitride will allow the use of wet etching processes to open the space between the gates, which is filled with oxide because the region will be bound by nitride on all sides, thereby further enabling an improved process window.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising", "includes", "including", "has," "having", "contains" or "containing", or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment", "an example embodiment", etc., indicate that the embodiment described can include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right", "left", "vertical", "horizontal", "top", "bottom", and derivatives thereof shall relate to the described structures and methods, as oriented in the drawing figures. The terms "overlying", "atop", "on top", "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to", such as, for example, "a first element selective to a second element", means that a first element can be etched and the second element can act as an etch stop.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication are not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor structure including a plurality of active regions including FETs such as FinFETs according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some transistor device architectures, such as FinFETs, employ semiconductor fins and side-gates that can be contacted outside the active region, resulting in increased device density and performance over lateral devices.

Figure 2:
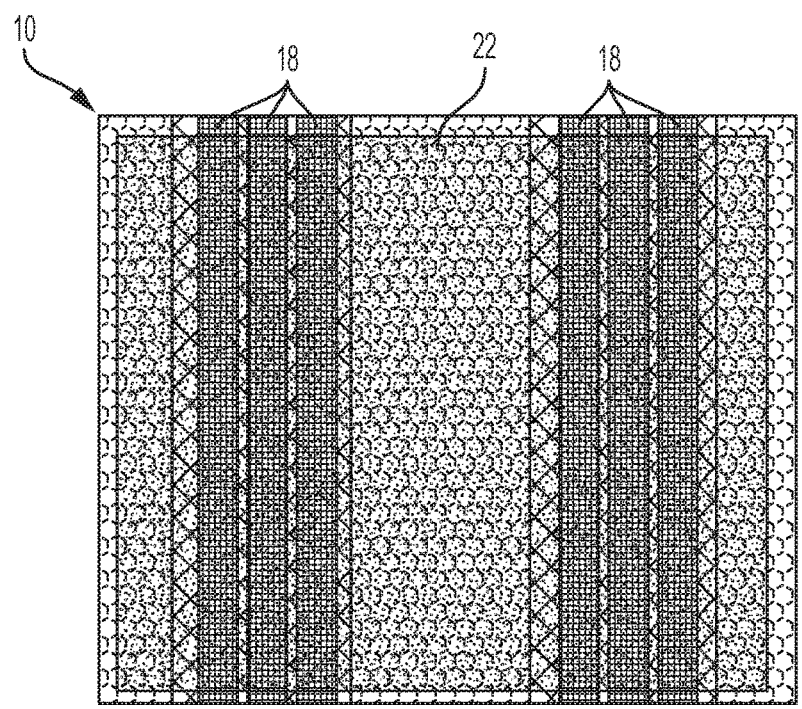
FIG. 2 depicts a top down view of the FinFET structure of FIG. 1.

FIGS. 1 and 2 illustrates a cross-sectional view and a top down view, respectively, representative of an exemplary FinFET structure 10 subsequent to formation of a source or drain epitaxial films (hereinafter referred to as the "source/drain"). It should be apparent that the present invention is not limited to this particular structure nor is it intended to be limited to any particular method for forming the FinFET. Itr should also be apparent that the present invention is suitable for device architectures utilizing shallow trench isolation regions, e.g., 2-D CMOS, 3-D FinFET architectures and the like.

The FinFET structure 10 subsequent to formation of the source/drain module generally includes the following components as shown. First, the structure 10 includes fins 16 formed on a substrate 12. As shown, one set of fins can be appropriately doped to form a pFET as labeled and the other group of fins can be doped to form an nFET as labeled. The particular doping, dopant type, and number of fins are not intended to be limited and the illustrated pFET and nFET are exemplary.

The substrate 12 can be any suitable substrate material, such as, for example, any semiconductor material including, but not limited to, Si, Ge, SiGe, SiC, SiGeC, II/IV, and III/V compound semiconductors such as, for example, InAs, GaAs, and InP. Multilayers of these semiconductor materials can also be used as substrate 12. In one or more embodiments and when substrate 12 is a remaining semiconductor material portion of a bulk semiconductor substrate, the substrate 12 can be of a single crystalline semiconductor material, such as, for example, single crystalline silicon. In some embodiments, the crystal orientation of the remaining semiconductor portion of the bulk semiconductor substrate can be {100}, {110}, 11111 or any other of the well-known crystallographic orientations. In some embodiments and when substrate 12 is a remaining semiconductor material portion of a bulk semiconductor substrate. As will be described in greater detail below, each semiconductor fin can include the same semiconductor material, or a different semiconductor material, from substrate 12.

In another embodiment, substrate 12 includes at least an insulator layer of a semiconductor-on-insulator (SOI) substrate (not specifically shown). Although not specifically shown, one skilled in the art understands that an SOI substrate includes a handle substrate, an insulator layer located on an upper surface of the handle substrate, and a semiconductor layer located on an uppermost surface of the insulator layer. The handle substrate provides mechanical support for the insulator layer and the semiconductor layer. The semiconductor layer of such an SOI substrate can be processed into semiconductor fins.

The handle substrate and the semiconductor layer of the SOI substrate can include the same, or different, semiconductor material. The term "semiconductor" as used herein in connection with the semiconductor material of the handle substrate and the semiconductor layer denotes any semiconductor material including, for example, Si, Ge, SiGe, SiC, SiGeC, II/VI, and III/V compound semiconductors such as, for example, InAs, GaAs, or InP. Multilayers of these semiconductor materials can also be used as the semiconductor material of the handle substrate and the semiconductor layer. In one or more embodiments, the handle substrate and the semiconductor layer are both formed of silicon. In some embodiments, the handle substrate is a non-semiconductor material including, for example, a dielectric material and/or a conductive material. In yet other embodiments, the handle substrate can be omitted and the substrate 104 includes only an insulator layer.

In one or more embodiments, the handle substrate and the semiconductor layer can have the same or different crystal orientation. For example, the crystal orientation of the handle substrate and/or the semiconductor layer can be 11001, 11101, or 11111. Other crystallographic orientations besides those specifically mentioned can also be used in the present application. The handle substrate and/or the semiconductor layer of the SOI substrate can be a single crystalline semiconductor material, a polycrystalline material, or an amorphous material. Typically, at least the semiconductor layer is a single crystalline semiconductor material.

The insulator layer of the SOI substrate and that can be employed as substrate 104 can be a crystalline or non-crystalline oxide and/or nitride. In one embodiment, the insulator layer is an oxide such as, for example, silicon dioxide. In another embodiment, the insulator layer is a nitride such as, for example, silicon nitride or boron nitride. In yet another embodiment, the insulator layer is a multi-layered stack of, in any order, silicon dioxide and one of silicon nitride or boron nitride.

The SOI substrate can be formed utilizing standard processes including for example, SIMOX (Separation by IMplantation of OXygen) or layer transfer. When a layer transfer process is employed, an optional thinning step can follow the bonding of two semiconductor wafers together. The optional thinning step reduces the thickness of the semiconductor layer to a layer having a thickness that is more desirable.

By way of example, the thickness of the semiconductor layer of the SOI substrate can be from 10 nm to 100 nm. Other thicknesses that are lesser than, or greater than, the aforementioned thickness range can also be used as the thickness of the semiconductor layer of the SOI substrate. The insulator layer of the SOI substrate caN have a thickness from 1 nm to 200 nm. Other thicknesses that are lesser than, or greater than, the aforementioned thickness range can also be employed as the insulator layer.

Any known composition, number, and manner of forming the vertically oriented semiconductor fin 16 can be utilized. In one or more embodiments, a patterned hard mask (not illustrated) is etched to expose portions of the substrate 12. The exposed portions of the substrate 12 can be removed to form a plurality of semiconductor fins. The patterned hard mask is then removed, by either wet or dry etch processes. A gate stack (not shown), including a gate metal, a high k dielectric region and a work function metal can be formed over a channel region of the semiconductor fin 16. Any known composition and manner of forming the gate stack can be utilized. The gate stack can be made of, for example, tungsten (W), titanium nitride (TiN), or the like during an operation for forming a VFET. In some embodiments, a high-k dielectric region is formed between the gate stack and the semiconductor fin 16 to modify the work function of the gate stack. The high-k dielectric region can be made of a binary or ternary high-k dielectric film, for example, $HfO_2$, $La_2O_3$, $Al_2O_3$, $TiO_2$, $HfSiO_4$, $LaAlO_3$ or the like.

Adjacent finFET devices formed on the substrate can be separated by shallow trench isolation regions 20. The shallow trench isolation regions 20 can be created early during the semiconductor device fabrication process, e.g., before the transistors such as the illustrated FinFET are formed. The key steps for forming the shallow trench isolation regions 20 typically involve etching a pattern of trenches in the substrate 12, depositing one or more dielectric materials (such as silicon dioxide) to fill the trenches and the local areas between fins 16, and removing the excess dielectric using a technique such as chemical-mechanical planarization.

Subsequent to epitaxial formation of the source or drain 18, the structure 10 further includes a dielectric layer 22, e.g., an interlayer dielectric layer, which is used to define the upper portion of the shallow trench isolation region. Dielectric layer 22 is a different material with respect to the bulk dielectric layer 20 filling the shallow trench isolation regions. Any known composition and manner of forming the dielectric layer 22 can be utilized. By way of example, the dielectric can include any dielectric material including inorganic dielectrics or organic dielectrics. Some examples of suitable dielectrics that can be used as the dielectric material include, but are not limited to: $SiO_2$, silsesquioxanes, carbon doped oxides (i.e., organo silicates) that include atoms of Si, C, 0 and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The ILD can be deposited by spin on processes, PECVD processes or the like as is generally known in the art.

Figure 3:
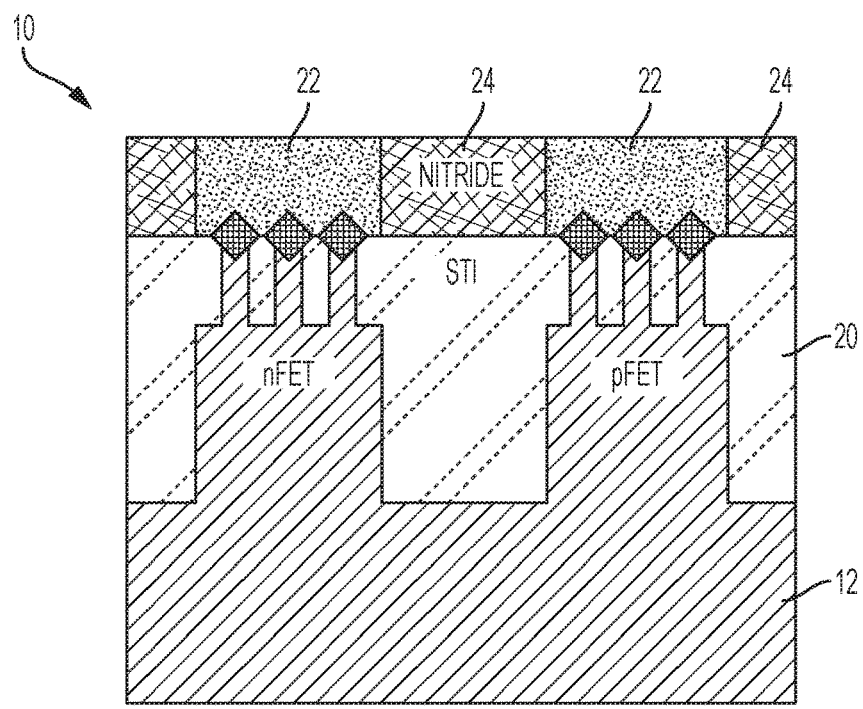
FIG. 3 depicts a cross-sectional view of the FinFET structure subsequent to patterning of the interlayer dielectric and filling openings therein with an etch resistant material according to one or more embodiments of the present invention.
Figure 4:
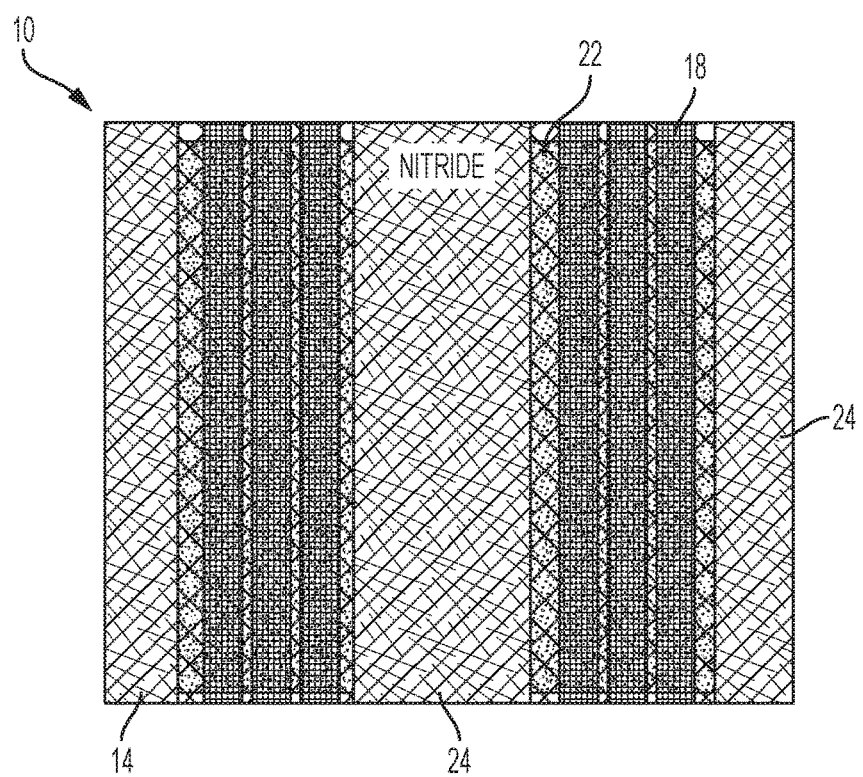
FIG. 4 depicts a top down view of the FinFET structure of FIG. 3.

Referring now to FIGS. 3 and 4, there are shown a cross-sectional view and top down view, respectively, of the FinFET structure 10 subsequent to patterning of the dielectric layer 22 through conventional lithography and etching processes. The lithographic step generally includes applying a photoresist to the surface of the dielectric layer, exposing the photoresist to a desired pattern of radiation, and developing the exposed resist utilizing a conventional resist developer to form a pattern. The etching process used to remove portions of the exposed dielectric layer can be a dry etching or wet etching process. The dielectric layer 22 is thus patterned such that openings are formed over the bulk regions of the STI layer.

The openings are filled with a material 24 resistant to a contact etch relative to the oxide or like material used to for the dielectric layer 22 that the etch resistant material replaced. Suitable etch resistant materials include, without limitation, silicon nitride ($Si_3N_4$), silicon oxycarbonitride (SIOCN), silicon borocarbonitride (SiBCN) or the like. A chemical mechanical polishing (CMP) procedure is then used to planarized the surface of the dielectric layer 22 including the material filled openings 24. The material filled openings provide the STI layer 20 with a dual layer structure, wherein the upper layer is of an etch resistant material such as silicon nitride. As will be discussed in greater detail below, the bilayer STI along with the conventional nitride gate caps (not shown) provide an increased area for self-aligned contact formation during source/drain contact formation.

Figure 5:
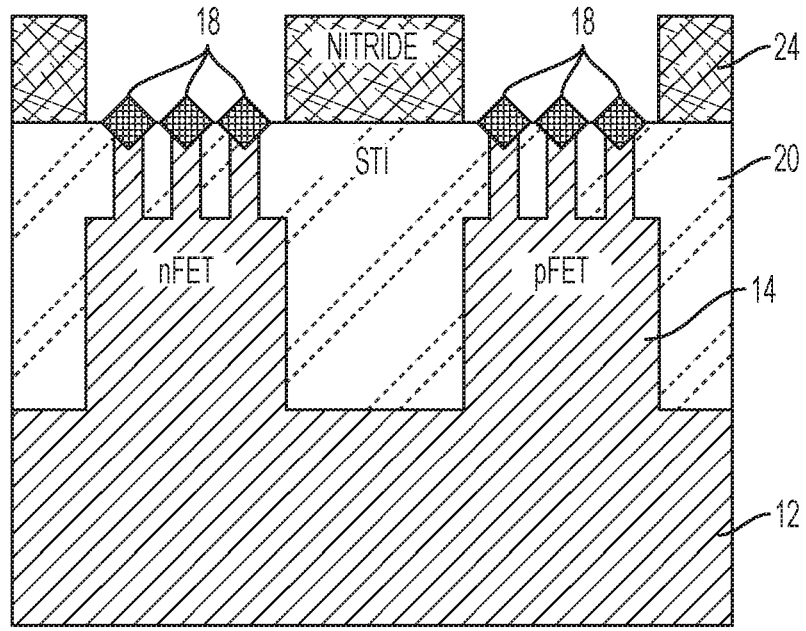
FIG. 5 depicts a cross-sectional view of the FinFET structure of FIG. 3 subsequent to selective removal of the remaining interlayer dielectric to the top source/drain regions according to one or more embodiments of the present invention.

Referring now to FIG. 5, an etch back process selective to the dielectric layer 20 is employed to remove the remaining portions of the dielectric layer 22, i.e., the dielectric layer overlaying the source/drain regions, thereby exposing at least a portion of the top source/drain regions 18. In one or more embodiments, the etch back process can remove a portion of the dielectric layer 20 but generally maintains the local dielectric between the fins 16. A pattern formed of the etch resistant material 24 remains and protects the bulk region of the STI layer 24.

The etching process can be a dry etching or wet etching process. The term "wet etching" generally refers to application of a chemical solution. This is preferably a time controlled dip in the etch solution. As noted above, replacing the top part of the STI dual layer with a nitride or any other material that has different wet etch properties compared to the dielectric layer 20, wet etch can be used to remove the dielectric between the gates instead of a conventional dry etch process. Moreover, the resulting structure and methods described herein enable further innovation of the etch resistant material on top of the STI regions to obtain desired electrical characteristics.

Preferred etch solutions include $HNO_3$, HCL, $H_2SO_4$, HF or combinations thereof. By way of example, the wet etching process can be a buffered oxide etch, which is also known as a buffered HF or BHF. BHF is a mixture of a buffering agent, such as ammonium fluoride ($NH_4F$), and hydrofluoric acid (HF). Concentrated HF (typically 49% HF in water) etches silicon dioxide too quickly for good process control and also peels photoresist used in lithographic patterning. Buffered oxide etch is commonly used for more controllable etching. HCl can be added to the BHF solutions if needed to dissolve any insoluble products that can form during the etch back.

A common buffered oxide etch solution includes a 6:1 volume ratio of 40% NH4F in water to 49% HF in water. The buffered oxide etch solution will etch the oxide at approximately 2 to 4 nanometers per second at 25 degrees Celsius. Temperature can be increased as needed to raise the etching rate.

Suitable dry etching processes can include reactive-ion-etching (RIE), ion beam etching, plasma etching, laser ablation, or the like.

Figure 6:
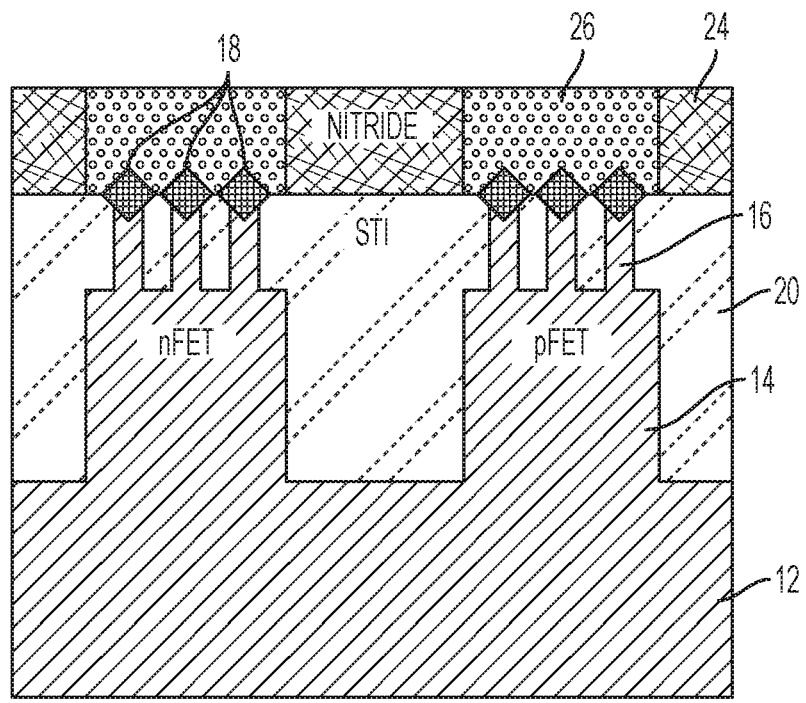
FIG. 6 depicts the cross-sectional view of the FinFET structure of FIG. 5 subsequent to metallization according to one or more embodiments of the present invention.
Figure 7:
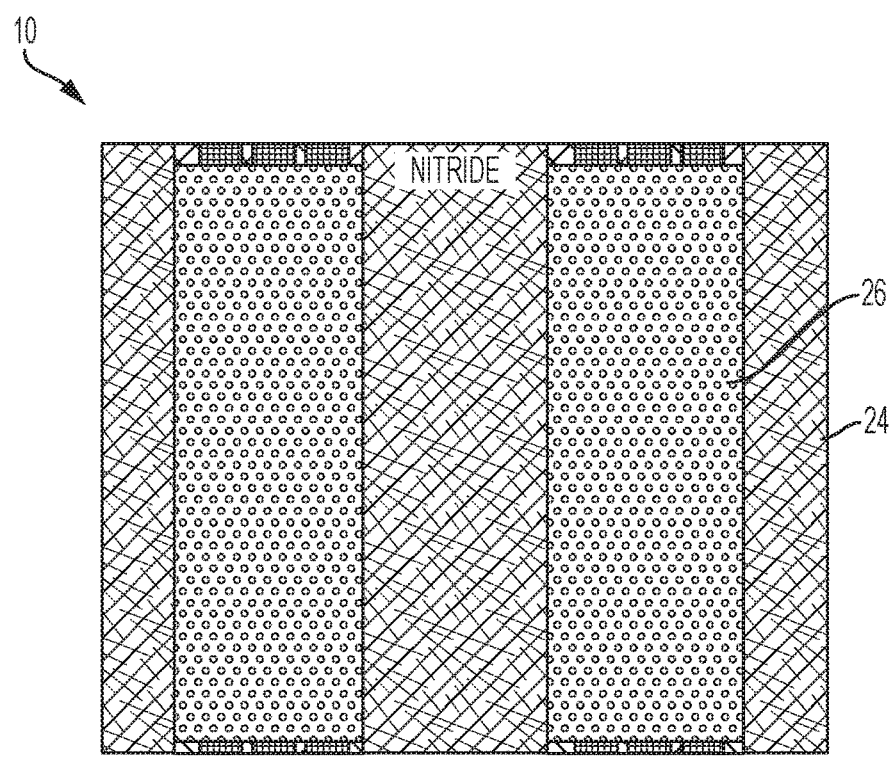
FIG. 7 depicts a top down view of the FinFET structure of FIG. 6.

FIGS. 6 and 7 illustrate a cross-sectional view and top down view, respectively, of the structure 10 subsequent to metallization. Metallization includes conformally depositing a liner layer onto the patterned substrate. The liner layer such as titanium or tungsten based liner can be deposited through conventional deposition processes such as, for example, a plasma vapor deposition process such as Rf sputtering. The thickness of the deposited liner layer is between 10 Angstroms and 40 Angstroms.

Next, a conductive metal 26 such as tungsten is then deposited into the contact hole to form a so-called tungsten plug using a deposition process including, but not limited to: CVD, PECVD, sputtering, chemical solution deposition or plating. Although tungsten is preferred, other suitable conductive materials include, for example, Cu, Al, Co and combinations thereof. The conductive material is filled into the contact hole.

A CMP procedure is next used to remove the regions of tungsten and the regions of titanium nitride layer residing on the etch resistant material 24 such that the upper surface of the tungsten plug is substantially coplanar with the upper surface of the etch resistant material 24. In addition to removal of the unwanted regions of material, via a CMP procedure, the removal procedure can also be accomplished via a blanket RIE procedure using a suitable etchant.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method of increasing a process margin for self-aligned contact formation to a field effect transistor (FET), the method comprising:
   providing an array of FETs, each one of the FETs separated from an adjacent FET by a shallow trench isolation region, the FETS including a source and/or drain region;
   filling the shallow trench isolation region with a first dielectric layer;
   depositing a second dielectric layer onto the first dielectric layer overlaying the shallow trench isolation region to provide the shallow trench isolation region with two dielectric layers, wherein the first and second dielectric layer comprise different etch rates;
   patterning the second dielectric layer to form openings overlying the shallow isolation trench region and filling the openings with an etch resistant material;
   forming contact openings in the second dielectric layer to expose the source and/or drain regions, wherein the contact openings are self-aligned to the etch resistant material; and
   filling the contact openings with an electrically conductive material.

2. The method of claim 1, wherein the etch resistant material comprises a nitride material.

3. The method of claim 1, wherein the etch resistant material comprises silicon nitride, silicon borocarbontiride, or silicon oxycarbonitride.

4. The method of claim 1, wherein filling the electrically conductive material comprises tungsten metal.

5. The method of claim 1, wherein the first and second dielectric layers are different materials.

6. The method of claim 1, wherein the second dielectric material comprises an oxide.

7. The method of claim 1, wherein the contact openings are self-aligned to the etch resistant material and a gate stack formed over channels within the FET.

8. The method of claim 1, wherein forming the contact openings in the second dielectric layer comprises exposing the substrate to a wet etch process.

9. The method of claim 1, wherein the FET comprises a finFET including one or more fins.

10. A method for contact patterning during fabrication of a semiconductor structure device, the method comprising:
    forming a dual layer shallow trench isolation region comprising a dielectric layer and an etch resistant layer overlying the dielectric layer, wherein the etch resistant layer has an increased etch resistance relative to the dielectric layer, and wherein the shallow trench isolation region separates adjacent field effect transistors (FETs);
    etching a contact opening in an oxide layer overlying a source or drain region, wherein the contact opening is self-aligning to the etch resistant layer overlying the shallow trench isolation region, and wherein the contact opening has a depth equal to a thickness of the etch resistant layer; and
    filling the contact opening with an electrically conductive material.

11. The method of claim 10, wherein the etch resistant material comprises a nitride material.

12. The method of claim 10, wherein the etch resistant material comprises silicon nitride, silicon borocarbontiride, or silicon oxycarbonitride.

13. The method of claim 10, wherein the electrically conductive material comprises tungsten.

14. The method of claim 10, wherein the FETs comprise a fin-type FET (finFET) including one or more fins.

15. The method of claim 10, wherein the oxide layer comprises a different material than the dielectric layer.

* * * * *